United States Patent
Iwamoto et al.

(10) Patent No.: US 9,553,253 B2
(45) Date of Patent: *Jan. 24, 2017

(54) METHOD FOR MANUFACTURING PIEZOELECTRIC DEVICE

(75) Inventors: Takashi Iwamoto, Kusatsu (JP); Hajime Kando, Ritto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 1386 days.

This patent is subject to a terminal disclaimer.

(21) Appl. No.: 12/608,113

(22) Filed: Oct. 29, 2009

(65) Prior Publication Data

US 2010/0112233 A1    May 6, 2010

(30) Foreign Application Priority Data

Oct. 31, 2008  (JP) .................... 2008-282568

(51) Int. Cl.
  *C23F 1/00*    (2006.01)
  *H01L 41/257*  (2013.01)
  (Continued)

(52) U.S. Cl.
  CPC ............ *H01L 41/257* (2013.01); *C23C 14/48* (2013.01); *C23C 14/58* (2013.01); *H01L 41/313* (2013.01); *H03H 3/02* (2013.01)

(58) Field of Classification Search
  CPC ...... H01L 41/253; H01L 41/257; H01L 41/33; H01L 41/332; H01L 41/09; H01L 41/18; H01L 41/22; H01L 41/312; C23C 14/48; C23C 14/58; H03H 3/02; H03H 9/17; H03H 3/04; H03H 2003/021–2003/028; H03H 2003/0407–2003/0492
  (Continued)

(56) References Cited

U.S. PATENT DOCUMENTS 5,875,053 A * 2/1999 Webjorn et al. ............ 359/326
6,767,749 B2 * 7/2004 Kub et al. ...................... 438/3
(Continued)

FOREIGN PATENT DOCUMENTS

EP    1 699 092 A2    9/2006
FR    2 914 492 A1    10/2008
(Continued)

OTHER PUBLICATIONS

English abstract of Fr 2914492 A1, published Oct. 2008.*
(Continued)

*Primary Examiner* — Marianne L Padgett
(74) *Attorney, Agent, or Firm* — Keating & Bennett, LLP (57) ABSTRACT

A lower electrode and an adhesive layer made of an insulator are formed on a back surface on the ion implantation layer side of a piezoelectric single crystal substrate. A supporting substrate in which sacrificial layers made of a conductive material have been formed is bonded to the surface of the adhesive layer. By heating the composite body including the piezoelectric single crystal substrate, the lower electrode, the adhesive layer, and the supporting substrate, a layer of the piezoelectric single crystal substrate is detached to form a piezoelectric thin film. A liquid polarizing upper electrode is formed on a detaching interface of the piezoelectric thin film. A pulsed electric field is applied using the polarizing upper electrode and the sacrificial layers as counter electrodes. Consequently, the piezoelectric thin film is polarized.

6 Claims, 8 Drawing Sheets

(51) Int. Cl.
  *C23C 14/58* (2006.01)
  *C23C 14/48* (2006.01)
  *H01L 41/313* (2013.01)
  *H03H 3/02* (2006.01)

(58) Field of Classification Search
  USPC .............. 216/2, 13, 27, 33–36, 41, 49, 54, 74–75, 216/77, 78, 96, 100, 102, 105–109; 427/523; 29/25, 35
  See application file for complete search history.

(56) References Cited

U.S. PATENT DOCUMENTS

| | | | |
|---|---|---|---|
| 8,278,802 B1* | 10/2012 | Lee et al. ........................ | 310/363 |
| 8,339,015 B2* | 12/2012 | Iwamoto et al. ......... | 310/313 R |
| 8,450,904 B2* | 5/2013 | Iwamoto et al. ......... | 310/313 R |
| 8,572,825 B2* | 11/2013 | Hayakawa et al. .......... | 29/25.35 |
| 8,601,657 B2* | 12/2013 | Ito ................................ | 29/25.35 |
| 8,764,998 B2* | 7/2014 | Araki et al. ..................... | 216/20 |
| 8,889,452 B2* | 11/2014 | Iwamoto ........................ | 438/53 |
| 8,932,686 B2* | 1/2015 | Hayakawa et al. ........... | 427/523 |
| 8,973,229 B2* | 3/2015 | Kando et al. ................ | 29/25.35 |
| 9,123,885 B2* | 9/2015 | Iwamoto .................. | H03H 3/02 |
| 9,385,301 B2* | 7/2016 | Kando et al. ......... | H01L 41/257 |
| 2005/0168105 A1 | 8/2005 | Yamada et al. | |
| 2010/0088868 A1* | 4/2010 | Kando et al. ................ | 29/25.35 |
| 2011/0220275 A1* | 9/2011 | Hayakawa et al. ........... | 156/247 |
| 2012/0098387 A1* | 4/2012 | Iwamoto et al. ......... | 310/313 B |
| 2012/0205754 A1* | 8/2012 | Iwamoto ........................ | 257/415 |
| 2013/0193809 A1* | 8/2013 | Araki ........................... | 310/365 |
| 2014/0139075 A1* | 5/2014 | Iwamoto ....................... | 310/364 |
| 2014/0167565 A1* | 6/2014 | Iwamoto ....................... | 310/348 |
| 2014/0167566 A1* | 6/2014 | Kando ........................... | 310/360 |
| 2014/0173862 A1* | 6/2014 | Kando et al. ................. | 29/25.35 |
| 2014/0175945 A1* | 6/2014 | Kando ........................... | 310/321 |
| 2014/0175949 A1* | 6/2014 | Kando ........................... | 310/363 |
| 2014/0191619 A1* | 7/2014 | Ito et al. ....................... | 310/358 |
| 2014/0231382 A1* | 8/2014 | Araki ............................. | 216/17 |

FOREIGN PATENT DOCUMENTS

| | | | | |
|---|---|---|---|---|
| JP | 5-90859 A | | 4/1993 | |
| JP | 2000-294754 A | * | 10/2000 | .......... H01L 21/302 |
| JP | 2003-017967 A | * | 1/2003 | ............... H03H 3/08 |
| JP | 2004-343359 A | * | 12/2004 | ............... H03H 3/08 |
| JP | 2007-43054 A | | 2/2007 | |

OTHER PUBLICATIONS

Takashi Iwamoto, "Method for Manufacturing Electronic Device and Method for Manufacturing Piezoelectric Device", U.S. Appl. No. 12/608,115, filed Oct. 29, 2009.

Kiyoto Araki et al., "Method for Manufacturing Composite Substrate", U.S. Appl. No. 13/192,500, filed Jul. 28, 2011.

Official Communication issued in corresponding European Patent Application No. 09173490.5, mailed on Aug. 3, 2011.

Iwamoto, "Method for Manufacturing Electronic Device and Method for Manufacturing Piezoelectric Device," U.S. Appl. No. 12/608,115, filed Oct. 29, 2009.

Hayakawa et al., "Method for Producing Piezoelectric Composite Substrate," U.S. Appl. No. 12/608,120, filed Oct. 29, 2009.

\* cited by examiner

METHOD FOR MANUFACTURING PIEZOELECTRIC DEVICE

BACKGROUND OF THE INVENTION

1. Field of the Invention

The present invention relates to a method for manufacturing a piezoelectric device that includes a piezoelectric single crystal thin film.

2. Description of the Related Art

Many piezoelectric devices obtained by thinning a piezoelectric single crystal body have been developed. In such a piezoelectric device, an electric field for polarization is applied to stabilize the polarization of the piezoelectric single crystal body that defines a piezoelectric thin film. For example, for a piezoelectric device disclosed in Japanese Unexamined Patent Application Publication No. 5-90859, a pair of metal films are formed on the front and back surfaces of a flat piezoelectric base material, and an electric field for polarization is applied using the pair of metal films as opposed electrodes. For a piezoelectric device disclosed in Japanese Unexamined Patent Application Publication No. 2007-43054, a lower electrode utilized to drive the piezoelectric device is used as an electrode for applying an electric field for polarization.

However, in the manufacturing method described in Japanese Unexamined Patent Application Publication No. 5-90859, an electric field is applied to the entire piezoelectric base material. Therefore, an electric field has to be applied to the composite substrate including the piezoelectric thin film and the supporting substrate, despite the fact that an electric field only needs to be applied to a piezoelectric thin film in a structure in which the piezoelectric thin film is supported by a supporting substrate. This requires the application of extremely high voltage. Consequently, breakage of a substrate occurs due to abnormal electric discharge or large-scale equipment for ensuring safety when performing high electric field application needs to be installed.

In the manufacturing method described in Japanese Unexamined Patent Application Publication No. 2007-43054, since a lower electrode of a piezoelectric device is used as an electrode for applying an electric field for polarization, an electric field for polarization cannot be applied to a piezoelectric device having no lower electrode.

SUMMARY OF THE INVENTION

To overcome the problems described above, preferred embodiments of the present invention provide a method for manufacturing a piezoelectric device in which a piezoelectric thin film can be polarized with certainty without applying an electric field greater than necessary for the polarization of the piezoelectric thin film, regardless of the presence or absence of a lower electrode.

According to a preferred embodiment of the present invention, a method for manufacturing a piezoelectric device includes an ion implantation step of forming an ion implantation layer by implanting ions into a piezoelectric substrate, a heated detachment step of detaching a layer of the piezoelectric substrate in which the ion implantation layer has been formed to form a piezoelectric thin film by heating the piezoelectric substrate, a polarization step of polarizing the piezoelectric thin film by applying an electric field to the detached piezoelectric thin film. This manufacturing method preferably includes a step of providing a supporting substrate in which a conductive sacrificial layer has been formed. In the polarization step, the sacrificial layer is used as an electrode to which the electric field is applied.

According to another preferred embodiment of the present invention, a method for manufacturing a piezoelectric device includes an ion implantation step of forming an ion implantation layer by implanting ions into a piezoelectric substrate, a heated detachment step of detaching a layer of the piezoelectric substrate in which the ion implantation layer has been formed to form a piezoelectric thin film by heating the piezoelectric substrate, a polarization step of polarizing the piezoelectric thin film by applying an electric field to the detached piezoelectric thin film. This manufacturing method preferably includes a sacrificial layer formation step of forming a conductive sacrificial layer on an ion implantation layer side of the piezoelectric substrate, and a supporting layer formation step of forming a supporting layer that supports the piezoelectric thin film after detachment, the supporting layer being formed on a surface of the piezoelectric substrate on which the sacrificial layer has been formed. In the polarization step, the sacrificial layer is used as an electrode to which the electric field is applied.

In the methods described above, an electric field for polarization is directly applied to a piezoelectric thin film using a sacrificial layer for forming a piezoelectric driving region or membrane of the piezoelectric thin film, the membrane not being supported by a supporting layer or a supporting substrate, without going through other media from the sacrificial layer. Furthermore, an electric field for polarization can be applied even if a piezoelectric driving electrode, such as a lower electrode, is not present at the position corresponding to the membrane.

In the method for manufacturing a piezoelectric device according to preferred embodiments of the present invention, the sacrificial layer is preferably formed so as to have an area greater than a piezoelectric driving region that is formed in the piezoelectric thin film.

In this manufacturing method, polarization treatment can be performed in an area greater than the piezoelectric driving region. Thus, a piezoelectric device having good characteristics can be manufactured as compared to a case in which only the piezoelectric driving region is polarized.

In the method for manufacturing a piezoelectric device according to preferred embodiments of the present invention, a pulsed electric field is preferably applied as an electric field for polarization.

In this manufacturing method, migration, which is a diffusion of a conductor defining the sacrificial layer into the piezoelectric thin film during the application of an electric field for polarization, can be effectively prevented by using a pulsed electric field.

The method for manufacturing a piezoelectric device according to preferred embodiments of the present invention preferably further includes a step of forming a diffusion preventing layer that prevents diffusion of a conductor defining the sacrificial layer to the piezoelectric substrate, the diffusion preventing layer being formed between an ion implantation layer-side surface of the piezoelectric substrate and the sacrificial layer.

In this manufacturing method, the migration described above can be effectively prevented with more certainty by providing the diffusion preventing layer.

In the method for manufacturing a piezoelectric device according to preferred embodiments of the present invention, the piezoelectric substrate preferably has a size that enables a plurality of piezoelectric devices to be formed, and the sacrificial layer is individually formed in a region corresponding to one of the piezoelectric devices while the sacrificial layers are short-circuited to each other through a short-circuit conductive layer.

In this manufacturing method, since a plurality of sacrificial layers are electrically connected to each other, polarization treatment can be simultaneously performed in a plurality of regions corresponding to individual piezoelectric devices.

In the method for manufacturing a piezoelectric device according to preferred embodiments of the present invention, a liquid conductor that is applied to a surface of the piezoelectric thin film is preferably used as an electrode opposing the sacrificial layer to perform polarization treatment, for example.

In this manufacturing method, an electrode for polarization that opposes the sacrificial layer can be easily formed and removed by using a liquid conductor.

According to various preferred embodiments of the present invention, polarization treatment can be performed with certainty using components in the existing manufacturing process without applying an electric field greater than necessary for the polarization of the piezoelectric thin film, regardless of the presence or absence of a lower electrode.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A method for manufacturing a piezoelectric device according to a first preferred embodiment of the present invention will be described with reference to the drawings. In the following description, a thin film piezoelectric device for a film bulk acoustic resonator (F-BAR) that uses a piezoelectric thin film is exemplified as the piezoelectric device.

Figure 1:
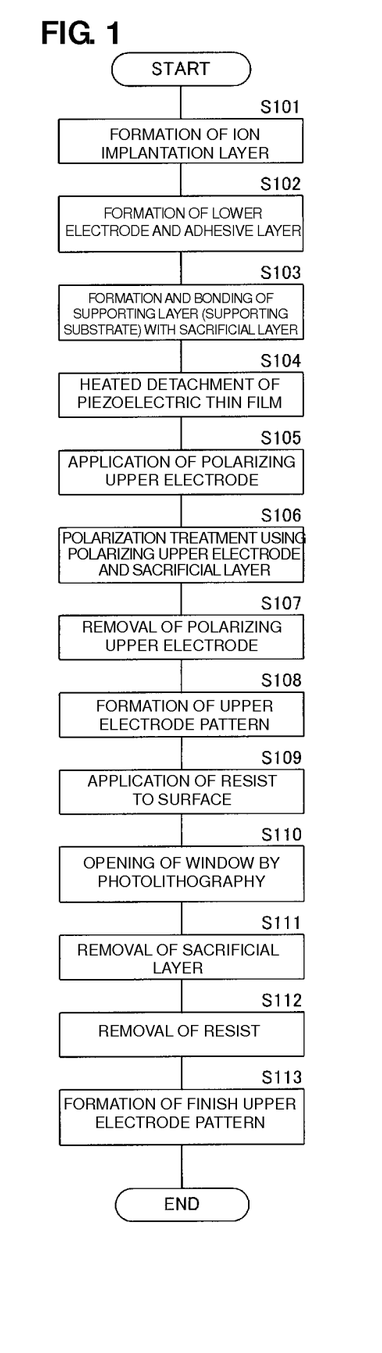
FIG. 1 is a flowchart showing a method for manufacturing a thin film piezoelectric device according to a first preferred embodiment of the present invention.

FIG. 1 is a flowchart showing a method for manufacturing a thin film piezoelectric device of this preferred embodiment. FIGS. 2A to 2E, 3A and 3B, 4A to 4D, and 5A and 5B schematically show the manufacturing processes of the thin film piezoelectric device formed in accordance with the manufacturing flow shown in FIG. 1.

Figure 2A:
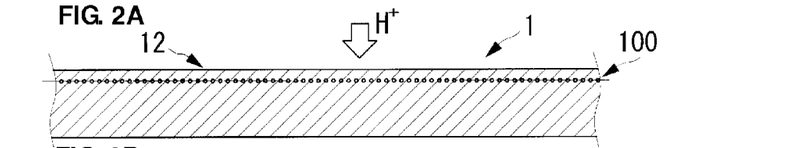
FIGS. 2A to 2E schematically show manufacturing processes of the thin film piezoelectric device formed in accordance with the manufacturing flow shown in FIG. 1.

A piezoelectric single crystal substrate 1 that has a certain thickness and an area in which a plurality of piezoelectric devices can be formed is prepared. As shown in FIG. 2A, hydrogen ions are implanted from the back surface 12 side to form an ion implantation layer 100 (FIG. 1: S101). For example, when a $LiTaO_3$ (LT) substrate is used as the piezoelectric single crystal substrate 1, a hydrogen ion layer is preferably formed at a depth of about 1 μm from the back surface 12 by implanting hydrogen ions at a dose amount of about $1.0 \times 10^{17}$ atom/cm² with an acceleration energy of about 150 keV, for example. Consequently, the ion implantation layer 100 is formed. Instead of the LT substrate, a $LiNO_3$ (LN) substrate, a $Li_2B_4O_7$ (LBO) substrate, or a $La_3Ga_5SiO_{14}$ (langasite) substrate may be used as the piezoelectric single crystal substrate 1, and ion implantation is performed under the conditions that are suitable for each of the substrates.

Figure 2B:
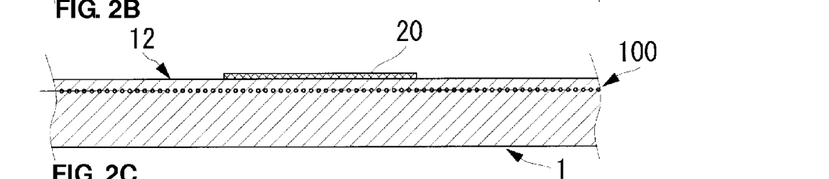
Figure 2C:
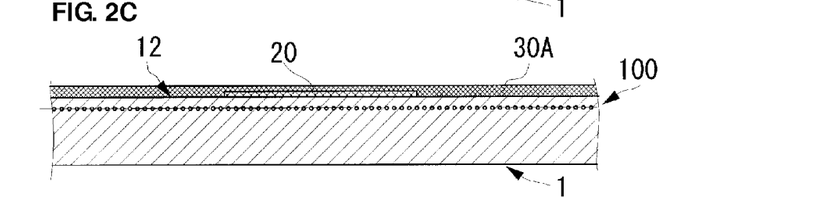

As shown in FIG. 2B, a lower electrode 20 having a desired thickness is formed preferably using aluminum (Al) or other suitable material. The lower electrode 20 is formed so as not to inhibit polarization during polarization treatment that is performed later, that is, so as not to be connected to the components other than a sacrificial layer 40 at least until a polarization step. Furthermore, as shown in FIG. 2C, an adhesive layer 30A is formed on the back surface 12 on which the lower electrode 20 has been formed (FIG. 1: S102). An insulating material, such as SiN, for example, is used as the adhesive layer 30A, and its surface is planarized by polishing, such as chemical mechanical polishing (CMP), for example. With such an insulating material, the adhesive layer 30A functions as a diffusion preventing layer between the sacrificial layer 40 and a piezoelectric thin film 10 during the polarization treatment performed later.

Figure 2D:
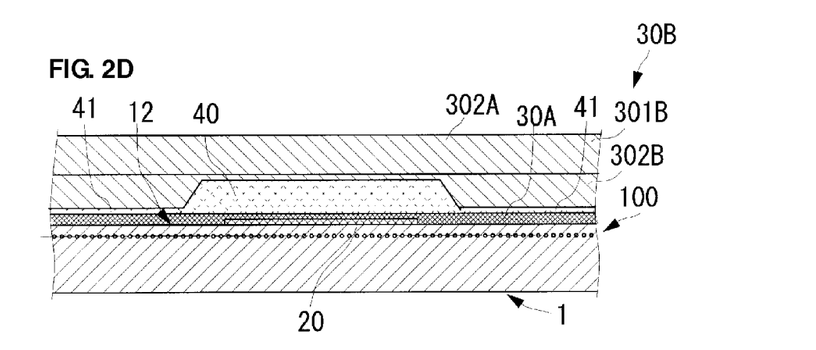

As shown in FIG. 2D, a supporting substrate 30B in which sacrificial layers 40 and 41 defined by a conductive material has been formed is bonded to the adhesive layer 30A (FIG. 1: S103).

The supporting substrate 30B is preferably made by forming a supporting layer 302B on a mother substrate 301B. Although the mother substrate 301B can be made of a piezoelectric material such as the piezoelectric single crystal substrate 1, Si or glass that is readily available and inexpensive and has a thermal expansion coefficient different from that of the piezoelectric single crystal substrate 1 but good thermal resistance may preferably be used, for example. In this description, the case in which Si is used is described. The supporting layer 302B made of $SiO_2$ is formed on the surface of the mother substrate 301B made of Si. In addition, by, for example, etching the supporting layer 302B, a depression for the sacrificial layers 40 and 41 is formed. The depression is then preferably filled with a conductive material, such as Cu, Al, or Ni, for example, to form the sacrificial layers 40 and 41. The surface of the supporting layer 302B is planarized by CMP or other suitable method.

The sacrificial layer 40 is formed so as to include at least the region corresponding to a piezoelectric driving region (membrane) as a piezoelectric device, that is, so as to have an area greater than the piezoelectric driving region. The sacrificial layer 41 is formed so as to have a pattern that connects the sacrificial layer 40 to the next sacrificial layer 40 formed in the piezoelectric driving region. The sacrificial layer 41 is preferably formed so as to be shallower and narrower than the sacrificial layer 40. The conductive material used for the sacrificial layers 40 and 41 should preferably be a material resistant to electro-migration.

The piezoelectric single crystal substrate 1 is bonded to the supporting substrate 30B by directly bonding the supporting layer 302B of the supporting substrate 30B to the surface of the adhesive layer 30A using a surface activated bonding technology. The surface activated bonding described herein is preferably a method in which bonding is performed while a joint surface is activated by applying Ar ions or other suitable ions under a vacuum. This bonding method does not require the application of heat.

Figure 2E:
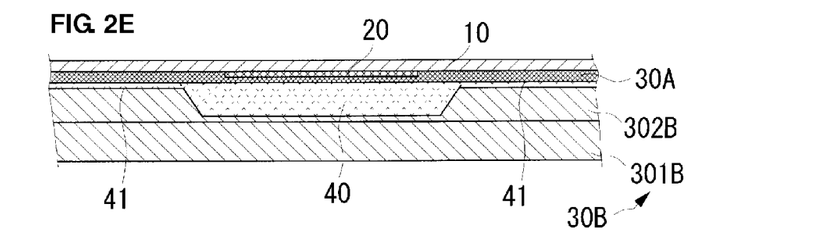

As shown in FIG. 2E, the piezoelectric single crystal substrate 1 to which the supporting substrate 30B is bonded is heated to perform detachment using the ion implantation layer 100 as a detaching interface (FIG. 1: S104). As a result, a piezoelectric thin film 10 that is supported by the supporting substrate 30B is formed. The surface 13 of the piezoelectric thin film 10 is planarized by polishing such as CMP, for example.

Figure 3A:
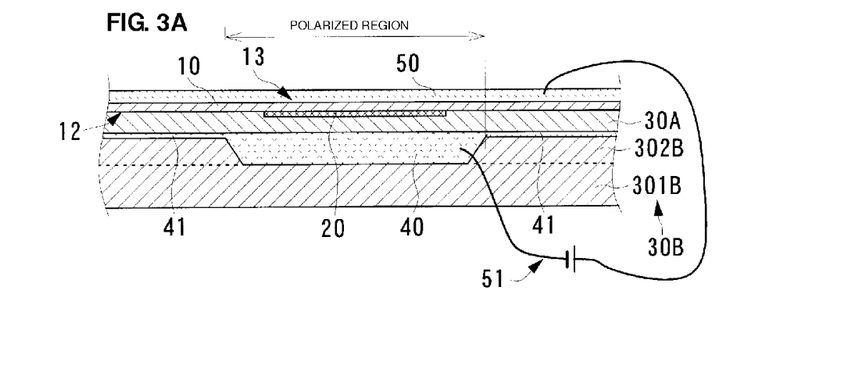
FIGS. 3A and 3B schematically show manufacturing processes of the thin film piezoelectric device formed in accordance with the manufacturing flow shown in FIG. 1.

As shown in FIG. 3A, a conductive liquid, such as a lithium chloride solution, for example, is applied to the surface 13 of the piezoelectric thin film 10 to form a liquid polarizing upper electrode 50 (FIG. 1: S105). The polarizing upper electrode 50 is connected to the sacrificial layers 40 and 41 using an electric field applying circuit 51 to apply a pulsed electric field (FIG. 1: S106). This polarizes the piezoelectric thin film 10 between the polarizing upper electrode 50 and the sacrificial layers 40 and 41, particularly the piezoelectric thin film 10 between the polarizing upper electrode 50 and the sacrificial layer 40.

Figure 3B:
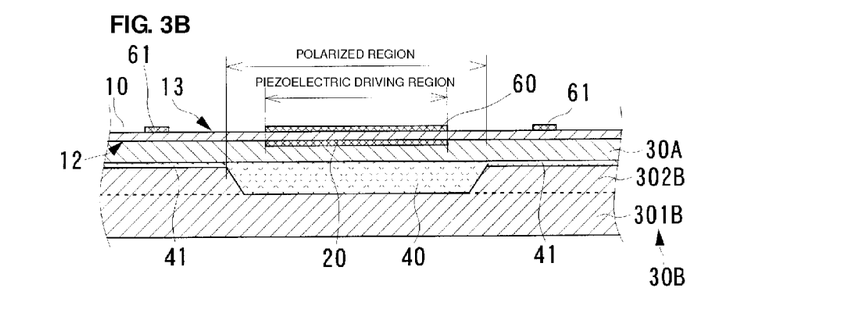

As shown in FIG. 3B, since the sacrificial layer 40 is formed so as to have an area greater than the piezoelectric driving region, the piezoelectric driving region and its peripheral region of the piezoelectric thin film 10 can be polarized with certainty. This widens the polarized region as compared to the case in which a lower electrode is used. Thus, a piezoelectric device having good characteristics can be manufactured.

Since the polarization treatment can be performed using the polarizing upper electrode 50 and the sacrificial layers 40 and 41 without going through the supporting substrate 30B, the polarization treatment can be performed with a reduced potential difference as compared to as case in which it is performed through the supporting substrate 30B. For example, in the case of a Z-cut LT substrate, the potential difference required for polarization is about 22 kV/mm, for example. In the existing method in which the polarization treatment is performed through the supporting substrate 30B, assuming that the piezoelectric thin film 10 has a thickness of about 1 μm and the supporting substrate 30B has a thickness of about 300 μm, a voltage of about 6600 V needs to be applied, for example. However, a voltage of only about 22 V may be applied in the method of this preferred embodiment. When the Z axis of the LT substrate is inclined by about 80 degrees, a voltage about 5.8 times greater must be applied, for example. However, with the method of this preferred embodiment, the applied voltage can be greatly reduced. This improves safety and large-scale equipment to ensure safety is unnecessary.

Since a pulsed electric field is applied, migration, which is the diffusion of a metal or a conductor constituting the sacrificial layers 40 and 41 to the piezoelectric thin film 10, can be effectively prevented. This prevents the degradation of a Q value of the piezoelectric thin film 10.

The sacrificial layers 40 corresponding to the plurality of piezoelectric driving regions are connected to each other through the sacrificial layers 41 as described above. Therefore, an electric field can be simultaneously applied to the plurality of sacrificial layers 40, that is, the plurality of piezoelectric driving regions. This significantly improves productivity as compared to the case in which an electric field is applied to individual sacrificial layers 40.

With a liquid conductor, the polarizing upper electrode 50 is easily formed. When the liquid conductor is made of a material having a desired viscosity, a short circuit to the lower electrode 20 is not caused even if minute holes are present in a portion of the piezoelectric thin film 10. Thus, the polarization treatment can be performed with certainty.

The polarizing upper electrode 50 is then removed (FIG. 1: S107). Since the polarizing upper electrode 50 is a liquid electrode, it is easily removed.

As shown in FIG. 3B, an upper electrode pattern including an upper electrode 60 and a bump pad 61 is formed on the surface 13 of the cleaned piezoelectric thin film 10 (FIG. 1: S108).

Figure 4A:
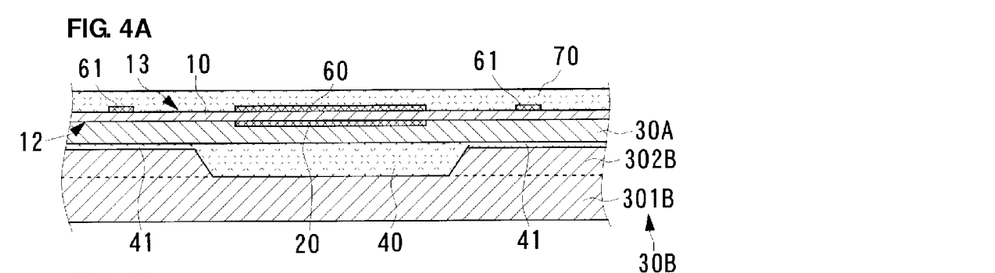
FIGS. 4A to 4D schematically show manufacturing processes of the thin film piezoelectric device formed in accordance with the manufacturing flow shown in FIG. 1.
Figure 4B:
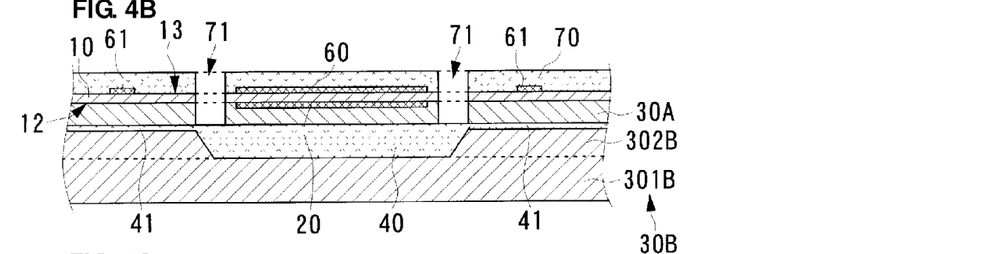

As shown in FIG. 4A, a resist film 70 is formed on the surface 13 of the piezoelectric thin film 10 on which the upper electrode pattern has been formed (FIG. 1: S109). As shown in FIG. 4B, an etching window 71 for removing the sacrificial layers 40 and 41 is formed in the resist film 70 by photolithography, for example (FIG. 1: S110). Although an etching window is formed only above the sacrificial layer 40 in FIG. 4B, another etching window may preferably be formed above the location of the sacrificial layer 41 between the piezoelectric devices adjacent to each other.

Figure 4C:
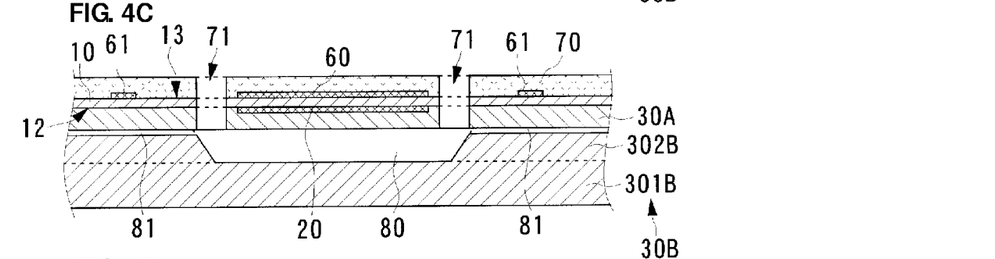
Figure 4D:
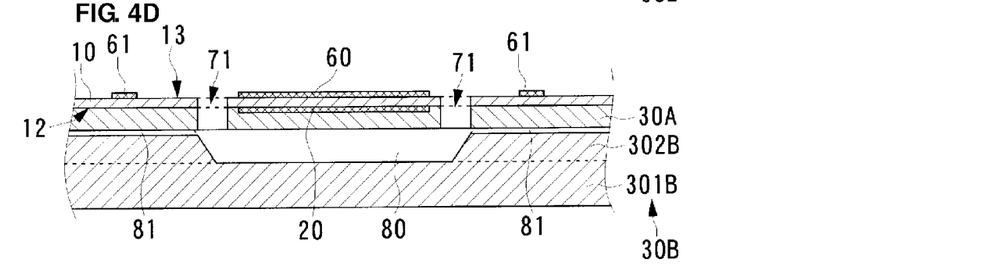

As shown in FIG. 4C, the sacrificial layers 40 and 41 are removed through the etching window 71. As a result, the space in which the sacrificial layer 40 was formed and that corresponds to the region in which the lower electrode 20 and the upper electrode 60 of a single thin film piezoelectric device are formed is changed to a depletion layer 80 (FIG. 1: S111). After the removal of the sacrificial layers 40 and 41, the resist film 70 is removed as shown in FIG. 4D (FIG. 1: S112).

Figure 5A:
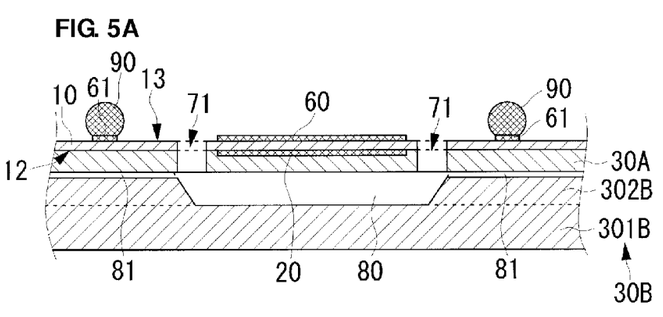
FIGS. 5A and 5B schematically show manufacturing processes of the thin film piezoelectric device formed in accordance with the manufacturing flow shown in FIG. 1.
Figure 5B:
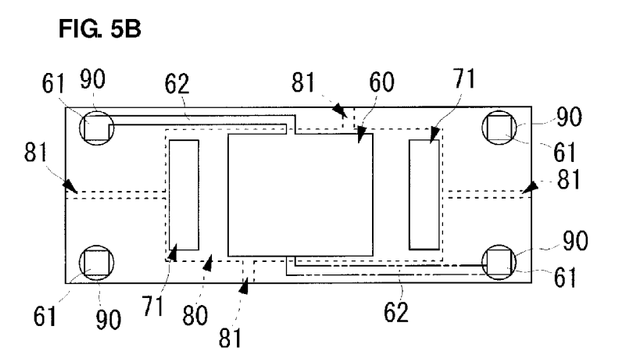

As shown in FIG. 5A, a bump 90 is formed on the bump pad 61 (FIG. 1: S113). As shown in FIG. 5B, a multi-device-pattern substrate is cut into individual thin film piezoelectric devices. Thus, a thin film piezoelectric device is formed.

In addition to various effects described in the above manufacturing flow, the following effects can be provided by this manufacturing method. By using a sacrificial layer for producing a space below a piezoelectric driving region as a polarizing electrode, polarization treatment can be conducted without forming another polarizing electrode. In addition, even a piezoelectric device having no lower electrode can be polarized with certainty. Since an adhesive layer made of an insulating material functions as a diffusion preventing layer, the migration described above can be more effectively prevented.

A method for manufacturing a piezoelectric device according to a second preferred embodiment of the present invention will be described with reference to the drawings.

Figure 6:
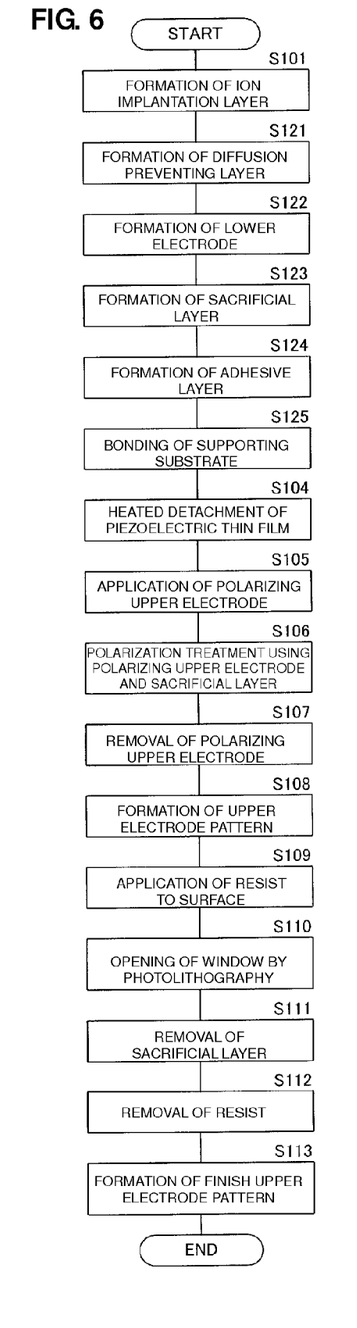
FIG. 6 is a flowchart showing a method for manufacturing a thin film piezoelectric device according to a second preferred embodiment of the present invention.

FIG. 6 is a flowchart showing a method for manufacturing a thin film piezoelectric device of this preferred embodiment. FIGS. 7A to 7E and 8A to 8D schematically show the manufacturing processes of the thin film piezoelectric device formed in accordance with the manufacturing flow shown in this preferred embodiment.

In the method for manufacturing a piezoelectric device of this preferred embodiment, methods for forming a diffusion preventing layer 45, sacrificial layers 40 and 41, and an adhesive layer 30A are different from those in the first preferred embodiment. The subsequent steps are the same or substantially the same as those in the first preferred embodiment. Accordingly, the manufacturing method is described up to a step of bonding a supporting substrate 30B'.

Figure 7A:
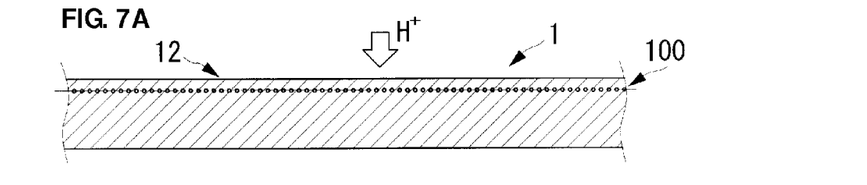
FIGS. 7A to 7E schematically show manufacturing processes of the thin film piezoelectric device formed in accordance with the manufacturing flow shown in FIG. 6.

As shown in FIG. 7A, hydrogen ions are implanted into a piezoelectric single crystal substrate 1 to form an ion implantation layer 100. The same or similar manufacturing method as in the first preferred embodiment can preferably be used.

Figure 7B:
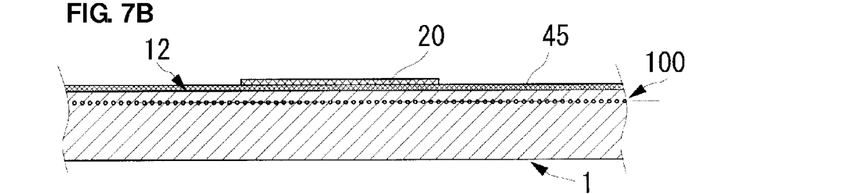

As shown in FIG. 7B, a diffusion preventing layer 45 made of an insulating material is formed on a back surface 12 (FIG. 6: S121). A lower electrode 20 is further formed on the diffusion preventing layer 45 (FIG. 6: S122). For example, SiN, SiC, TaN, TiN, WN, or Ta may preferably be used for the diffusion preventing layer 45. The same or similar material as in the first preferred embodiment can preferably be used for the lower electrode 20.

Figure 7C:
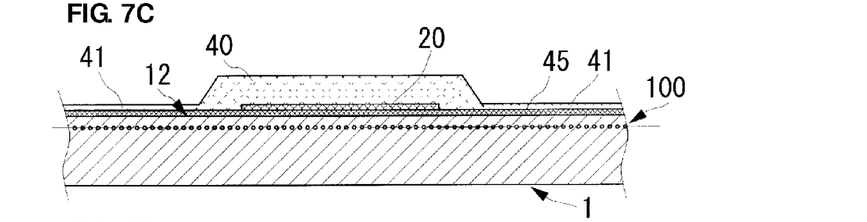

As shown in FIG. 7C, sacrificial layers 40 and 41 are patterned on the surface of the diffusion preventing layer 45 on which the lower electrode 20 has been formed (FIG. 6: S123). As in the first preferred embodiment, a metal such as Cu, Al, or Ni or a conductive paste, for example, may preferably be used for the sacrificial layers 40 and 41. A forming method, such as sputtering, electron beam (EB) deposition, chemical-vapor deposition (CVD), or printing, for example, may preferably be used in accordance with the material. A patterning method such as wet etching, dry etching, liftoff, or metal mask printing, for example, may preferably be used in accordance with the material.

Figure 7D:
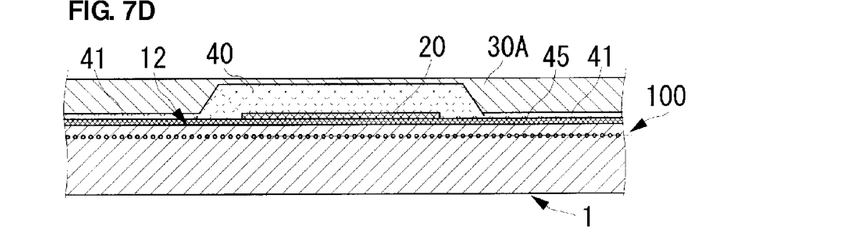

As shown in FIG. 7D, an adhesive layer 30A made of an insulator is formed, and the surface of the adhesive layer 30A is planarized by polishing such as CMP, for example (FIG. 6: S124). The same or similar material as in the first preferred embodiment can preferably be used for the adhesive layer 30A.

Figure 7E:
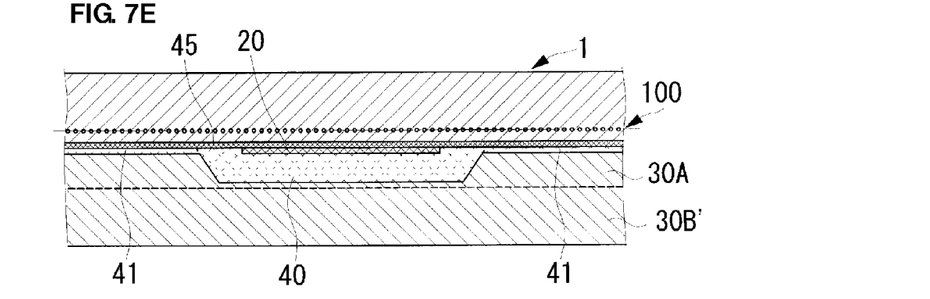
Figure 8A:
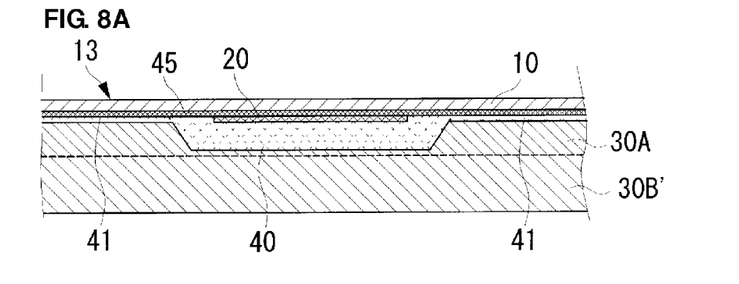
FIGS. 8A to 8D schematically show manufacturing processes of the thin film piezoelectric device formed in accordance with the manufacturing flow shown in FIG. 6.
Figure 8B:
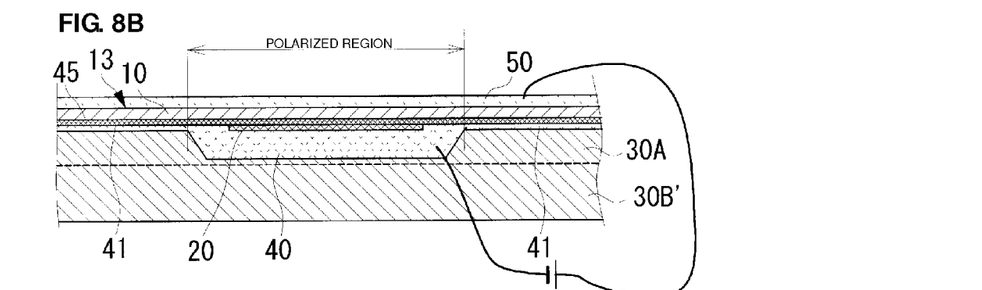
Figure 8C:
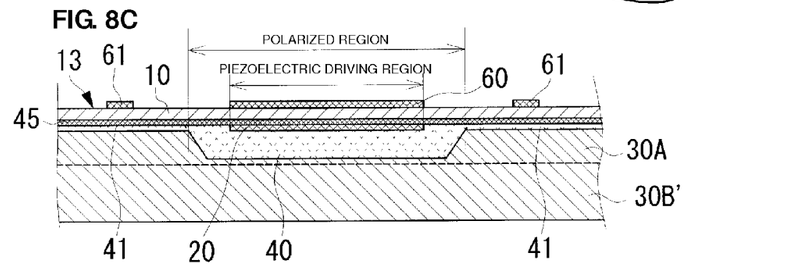
Figure 8D:
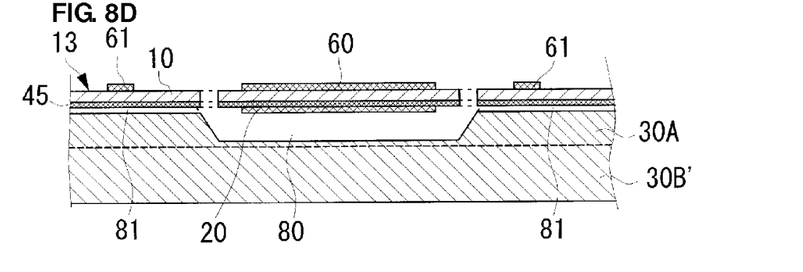

As shown in FIG. 7E, a supporting substrate 30B' made of Si or other suitable material is directly bonded to the adhesive layer 30A (FIG. 6: S125). The same or similar bonding method as in the first preferred embodiment can preferably be used.

After a composite substrate including the piezoelectric single crystal substrate 1, the diffusion preventing layer 45, the lower electrode 20, the sacrificial layers 40 and 41, the adhesive layer 30A, and the supporting substrate 30B' is formed, a piezoelectric device can preferably be manufactured through the same or similar steps as those in the first preferred embodiment (refer to the steps after S104 in FIG. 6 and FIGS. 8A to 8D).

By providing the diffusion preventing layer 45 as described in this preferred embodiment, the diffusion of a metal defining the lower electrode 20 and the sacrificial layers 40 and 41 into the piezoelectric thin film 10 can be prevented with more certainty. Consequently, a piezoelectric device having better characteristics can be manufactured.

Although an F-BAR device has been described above, the manufacturing method according to various preferred embodiments of the present invention can be applied to other piezoelectric devices.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:
1. A method for manufacturing a composite substrate of a piezoelectric device comprising:

an ion implantation step of implanting ions into a piezoelectric substrate to form an ion implantation layer at a depth within the piezoelectric substrate;
a sacrificial layer formation step of forming an electrically conductive sacrificial layer on a first main surface of the piezoelectric substrate that is closer to the ion implantation layer than a second main surface of the piezoelectric substrate opposed to the first main surface;
a supporting layer bonding step of bonding a supporting layer to the first main surface of the piezoelectric substrate on which the electrically conductive sacrificial layer has been formed;
a heated detachment step of detaching a portion of the piezoelectric substrate in which the ion implantation layer has been formed by heating the piezoelectric substrate, the detached portion of the piezoelectric substrate being a piezoelectric thin film that has the electrically conductive sacrificial layer formed on the first main surface; and
a polarizing upper electrode formation step of forming a polarizing upper electrode on a surface of the piezoelectric thin film; and
a polarization step of polarizing the piezoelectric thin film by applying an electric field to the piezoelectric thin film; wherein
the supporting layer provided during the supporting layer bonding step, is capable of supporting the piezoelectric thin film;
in the polarization step, the electrically conductive sacrificial layer is used as an electrode, which consists of the electrically conductive sacrificial layer, to which the electric field is applied, and the polarizing upper electrode is connected to the electrically conductive sacrificial layer by an electric field applying circuit configured to apply the electric field; and
in the sacrificial layer formation step, the electrically conductive sacrificial layer is arranged to be removed in a subsequent step so as not to be included in the piezoelectric device that includes the composite substrate finally produced by the method.

2. The method for manufacturing a composite substrate of a piezoelectric device according to claim 1, wherein the electrically conductive sacrificial layer is formed so as to have an area greater than a piezoelectric driving region of the piezoelectric thin film in the piezoelectric device.

3. The method for manufacturing a composite substrate of a piezoelectric device according to claim 1, wherein, in the polarization step, a pulsed electric field is applied as the electric field.

4. The method for manufacturing a composite substrate of a piezoelectric device according to claim 1, further comprising a step of forming a diffusion preventing layer between the first main surface of the piezoelectric substrate and the electrically conductive sacrificial layer to prevent diffusion of the electrically conductive sacrificial layer into the piezoelectric thin film.

5. The method for manufacturing a composite substrate of a piezoelectric device according to claim 1, wherein
the piezoelectric substrate has an area that enables a plurality of composite substrates to be formed therefrom; and
the electrically conductive sacrificial layer is individually formed in a regions of the piezoelectric device in which each of the plurality of composite substrates are to be formed and each of the individually formed electrically conductive sacrificial layers are connected to one another by another conductive sacrificial layer.

6. The method for manufacturing a composite substrate of a piezoelectric device according to claim 1, wherein, in the polarization step, a liquid conductor is applied to the surface of the piezoelectric thin film opposed to the first surface and is used as an electrode opposing the electrically conductive sacrificial layer, the liquid conductor forming the polarizing upper electrode.

* * * * *